(12) United States Patent
Fujimoto

(10) Patent No.: US 9,099,446 B2
(45) Date of Patent: Aug. 4, 2015

(54) SEMICONDUCTOR DEVICE AND METHOD FOR PRODUCING SAME

(71) Applicant: PS4 LUXCO S.A.R.L., Luxembourg (LU)

(72) Inventor: Hiroyuki Fujimoto, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 14/304,069

(22) Filed: Jun. 13, 2014

(65) Prior Publication Data

US 2014/0367864 A1 Dec. 18, 2014

(30) Foreign Application Priority Data

Jun. 13, 2013 (JP) .................................. 2013-124560

(51) Int. Cl.
*H01L 49/02* (2006.01)
*H01L 23/48* (2006.01)
*H01L 21/768* (2006.01)
*H01L 27/108* (2006.01)

(52) U.S. Cl.
CPC ........ *H01L 23/481* (2013.01); *H01L 21/76879* (2013.01); *H01L 27/10852* (2013.01); *H01L 27/10855* (2013.01); *H01L 28/90* (2013.01); *H01L 27/10894* (2013.01)

(58) Field of Classification Search
CPC .. H01L 21/76879; H01L 23/481; H01L 28/90

USPC .......................................... 257/775; 438/666
See application file for complete search history.

(56) References Cited

U.S. PATENT DOCUMENTS

| 5,476,807 | A | * | 12/1995 | Lee et al. ....................... 438/396 |
| 5,481,127 | A | * | 1/1996 | Ogawa ........................... 257/308 |
| 5,858,834 | A | * | 1/1999 | Hirota et al. ................... 438/253 |
| 2007/0123032 | A1 | | 5/2007 | Yamazaki | |
| 2009/0286396 | A1 | | 11/2009 | Yamazaki | |

FOREIGN PATENT DOCUMENTS

JP 2007-150083 A 6/2007

* cited by examiner

*Primary Examiner* — Luan C Thai
(74) *Attorney, Agent, or Firm* — Kunzler Law Group, PC

(57) ABSTRACT

A method for producing a semiconductor device includes: a process for forming a first conductor on a first interlayer insulating film provided on a semiconductor substrate, a process for forming in order a first stopper interlayer film, a second interlayer insulating film, a second stopper interlayer film, and a third interlayer insulating film on the first interlayer insulating film to cover the first conductor, a process for penetrating the third interlayer insulating film, the second stopper interlayer film, and the second interlayer insulating film, and forming a first contact hole having a first inner diameter on a position corresponding to the first conductor, a process for expanding the inner diameter of the first contact hole on the second interlayer insulating film to a second inner diameter larger than the first inner diameter, and a process for forming on the first stopper interlayer film a second contact hole.

11 Claims, 8 Drawing Sheets

SEMICONDUCTOR DEVICE AND METHOD FOR PRODUCING SAME

TECHNICAL FIELD

The present invention relates to a semiconductor device, and more particularly to a method for producing a semiconductor device.

BACKGROUND ART

With densification of semiconductor devices represented by dynamic random access memory (DRAM) and the like, the occupancy area of various components that configure the semiconductor device is being reduced. With semiconductor devices that adopt a configuration that layers a plurality of components, the reduction of the occupancy area of each component decreases an overlapping margin that permits position shift of components on a lower layer and components on an upper layer in the production process. A shortage of overlapping margins causes problems such as a reduction of contact area due to position shift and an increase in contact resistance by such reduction, as well as disconnection, when the overlapping component is a conductor such as a contact plug.

As one related technology to resolve the above problem, there is the method for producing a semiconductor device disclosed in Japanese Unexamined Patent Application Publication No. 2007-150083 (Patent Document 1).

In this method, first, a (second) interlayer insulating film, an etch stop film, and a (third) interlayer insulating film are layered in order on a (first) interlayer insulating film having a contact plug formed thereon. Next, to form a through-hole that reaches the contact plug, an upper portion of the through-hole is formed on the (third) interlayer insulating film and the etch stop film through anisotropic etching. After forming an etch protective film on a side wall of the upper portion of the through-hole, a lower portion of the through-hole is formed on the (second) interlayer insulating film through isotropic etching. The lower portion of the through-hole formed in this manner has a larger diameter compared to the upper portion. As a result, a contact area between the contact plug and a via plug formed in the through-hole can be larger, and contact resistance therebetween can be reduced.

BACKGROUND DOCUMENTS

Patent Documents

Patent Document 1: Japanese Unexamined Patent Application Publication No. 2007-150083

SUMMARY OF INVENTION

Technical Problem

With the method of producing a semiconductor device disclosed in Patent Document 1, the (second) interlayer insulating film is formed on the (first) interlayer insulating film having the contact plug formed thereon. Because of this, there is a possibility that etching will reach the (first) interlayer insulating film when isotropically etching the (second) interlayer insulating film. Therefore, the lower portion of the through-hole cannot be sufficiently widened.

Solution To Problem

A method for producing a semiconductor device according to one embodiment of the present invention includes a process for forming a first conductor on a first interlayer insulating film provided on a semiconductor substrate, a process for forming in order a first stopper interlayer film, a second interlayer insulating film, a second stopper interlayer film, and a third interlayer insulating film on the first interlayer insulating film to cover the first conductor, a process for penetrating the third interlayer insulating film, the second stopper interlayer film, and the second interlayer insulating film, and forming a first contact hole having a first inner diameter on a position corresponding to the first conductor, a process for expanding the inner diameter of the first contact hole on the second interlayer insulating film to a second inner diameter larger than the first inner diameter, and a process for forming on the first stopper interlayer film a second contact hole successive to the first contact hole, having a third inner diameter larger than the first inner diameter, and exposing the first conductor.

Further, a semiconductor device according to another embodiment of the present invention includes a first interlayer insulating film, a first stopper interlayer film, a second interlayer insulating film, and a second stopper interlayer film that are layered in order on a semiconductor substrate, a first conductor formed on the first interlayer insulating film, and a crown-shaped second conductor including a lower portion that penetrates the first stopper interlayer film, the second interlayer insulating film, and the second stopper interlayer film and is connected to the first conductor, and an upper portion that protrudes more towards the upside than the second stopper interlayer film, wherein an outer diameter of the lower portion is larger than an outer diameter of the upper portion.

Advantageous Effects of Invention

According to the present invention, by interposing a first stopper interlayer film between a first interlayer insulating film and a second interlayer insulating film, there is no possibility of the first interlayer insulating film being etched when widening a portion of a first contact hole and the second interlayer insulating film. Because of this, the portion of the first contact hole and the second interlayer insulating film can be widened to a maximum limit. Using this portion of the first contact hole that is widened to a maximum limit, forming a second contact hole on the first stopper interlayer film, the second contact hole with a diameter larger than the diameter of a first conductor can be formed without etching the first interlayer insulating film. As a result, the contact area between a second conductor formed in the second contact hole and the first conductor is expanded and contact resistance can be reduced.

DETAILED DESCRIPTION OF THE INVENTION

In the following, embodiments of the present invention are described in detail with reference to the drawings.

First, the configuration of the semiconductor device according to a first embodiment of the present invention will be described with reference to FIGS. 1A, 1B, and 1C.

Figure 1A:
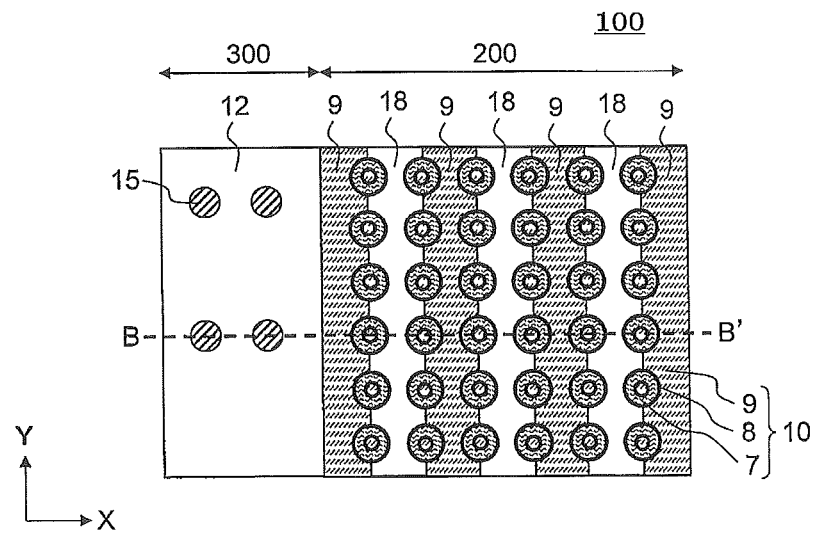
FIG. 1A is a cross-sectional view illustrating a planar layout of one portion of a semiconductor device according to a first embodiment of the present invention.
Figure 1B:
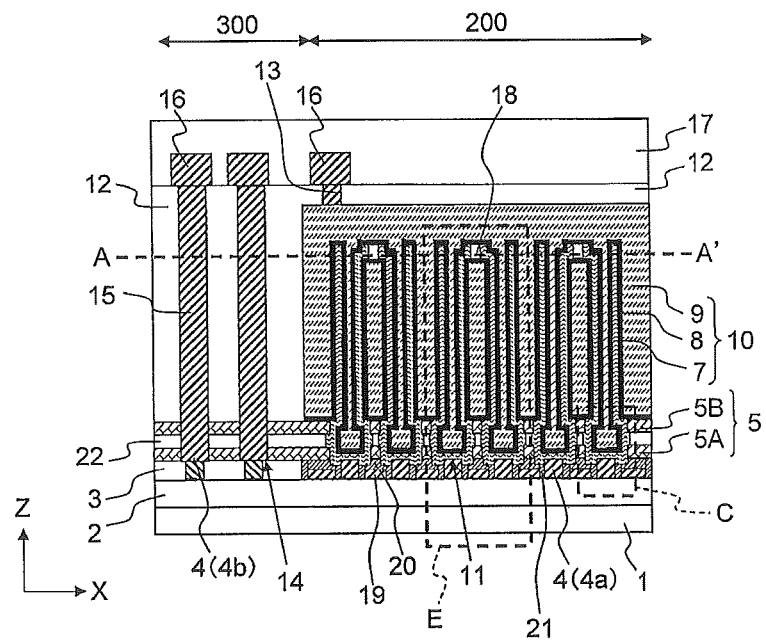
FIG. 1B is a cross-sectional view at the line B-B' in FIG. 1A.
Figure 1C:
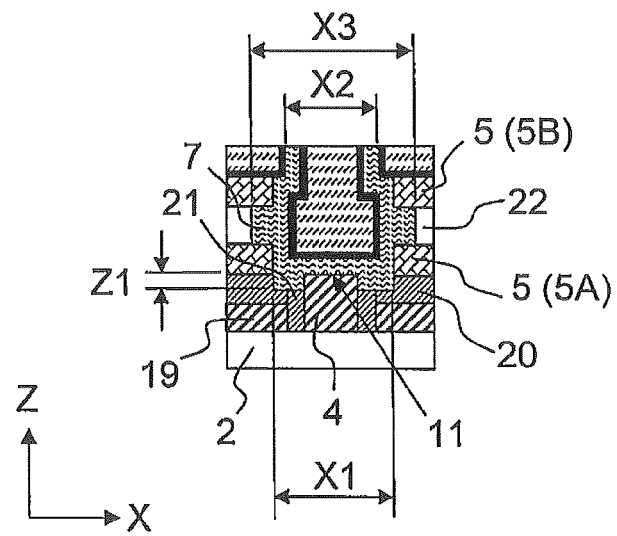
FIG. 1C is an enlarged view of the inside of dashed-line frame C in FIG. 1B.

FIG. 1A is a diagram illustrating a planar layout of one portion of the semiconductor device according to the first embodiment of the present invention, and a cross-sectional view of the line A-A' in FIG. 1B, FIG. 1B is a cross-sectional view of the line B-B' in FIG. 1A, and FIG. 1C is an enlarged view of the inside of the dashed-line frame C in FIG. 1B. A semiconductor device 100 illustrated is a dynamic random access memory (DRAM), but the present invention can apply to semiconductor devices that are not DRAM as well.

As illustrated in FIG. 1A, the semiconductor device 100 includes a memory cell region 200 and a peripheral circuit region 300.

A plurality of memory cells are arrayed and formed along the X and Y-direction on the memory cell region 200. Each memory cell includes a cell transistor (not illustrated) and a (cell) capacitor 10. Each capacitor 10 includes a lower electrode 7, a capacitor insulating film 8 formed to cover the inner peripheral face and the outer peripheral face, and an upper electrode formed on the capacitor insulating film 8 to embed the lower electrode 7. Note that in FIG. 1A, the upper electrode 9 is drawn in stripes, but as can be understood in FIG. 1B, the upper electrode 9 is formed to cover all cell capacitors 10.

A central position of each capacitor is on the intersection of a virtual line extending in the X-direction and a virtual line extending in the Y-direction in the memory cell region. The plurality of capacitors are disposed in square lattice in equal intervals with relation to the X-direction and the Y-direction. However, the disposal of the capacitors 10 is not limited to this example, and various kinds of disposals are possible.

A support film 18 is connected to one portion of the outer peripheral face of each lower electrode 7. The support film 18 is disposed to connect between each lower electrode 7 and at least one other lower electrode 7 positioned around it. In FIG. 1A, an example is illustrated where the support film 18 is disposed in stripes, but is not limited to this, and it may be another shape such as a honeycomb shape or an island shape.

A peripheral circuit (not illustrated) for driving the memory cells is disposed on the peripheral circuit region 300. The peripheral circuit is covered by a plurality of layers including the interlayer insulating film 12, and is electrically connected to a contact plug 15 formed penetrating these layers.

Referring to FIG. 1B, the semiconductor 100 has a semiconductor substrate 1. For the semiconductor substrate 1, for example, a silicon substrate can be used.

A plurality of elements which are not illustrated are formed on each of the memory cell regions 100 and the peripheral circuit region 300 of the semiconductor substrate 1. For example, an element isolation region (not illustrated) which partitions a plurality of active regions (not illustrated) is formed on the memory cell region 200 of the semiconductor substrate 1. A pair of impurity diffusion layers (not illustrated) are formed on each active region. Further, a gate insulating film and a gate electrode (both not illustrated) are layered to continuously cross the plurality of active regions on the semiconductor substrate 1. A metal oxide semiconductor (MOS) transistor which is a cell transistor is configured by the pair of active regions, the gate insulating film, and the gate electrode.

The interlayer insulating film 2 that covers the plurality of elements is formed on the silicon substrate 1 with the plurality of elements formed thereon.

A plurality of bit-lines 19 and a mask film 20 layered on top of the bit-lines 19, are provided on the top surface of the interlayer insulating film 2 of the memory cell region 200. The plurality of bit-lines 19 each extend in the Y-direction and are arranged at intervals in the X-direction. Each bit-line 19 is electrically connected to an impurity diffusion region of one of the plurality of cell transistors arranged in the Y-direction. The pair of first contact plugs not illustrated is provided penetrating the interlayer insulating film 2 corresponding to each cell transistor, and one of the first contact plugs electrically connects between the impurity diffusion region of one of the cell transistors and the corresponding bit-line 19.

A side wall insulating film 21 is provided on the side walls of the bit-lines 19 and the mask film 20. The top surface of the interlayer insulating film 2 is covered by the bit-lines 19 and side wall insulating film 21, and a first interlayer insulating film 3. Although not shown in FIG. 1B, the first interlayer insulating film 3 is also in the memory cell region 200.

A plurality of first conductors 4 (4a and 4b) are formed to penetrate the first interlayer insulating film 3. The plurality of first conductors 4a of the memory cell region 200 are each formed to correspond to cell transistors and contact the side wall insulating film 21. Each of the first conductors 4a are electrically connected to the impurity diffusion region on the other side of the corresponding cell transistor via the other side of the first contact plug penetrating the interlayer insulating film 2.

A first stopper interlayer film 5A, a second interlayer insulating film 22, and a second stopper interlayer film 5B are sequentially layered to cover the mask film 20 and a side wall film 21. Note that below, the first stopper interlayer film 5A and the second stopper interlayer film 5B combined are referred to as the stopper interlayer film 5.

A hole 11 penetrating the second stopper interlayer film 5B, the second interlayer insulating film 22, and the first stopper interlayer film 5A is formed on each corresponding position of the first conductor 4a in the memory cell region 200. A lower portion of the lower electrode 7 is provided in the hole 11, and the outer wall face of the lower electrode 7 contacts the inner wall face of the hole 11. The lower electrode 7 includes an upper portion protruding upward from the second stopper interlayer film 5B, and has an overall crown shape.

Here, with reference to FIG. 1C, an outer diameter X1 of the lower electrode 7 on the film of the stopper interlayer film 5 is larger than an outer diameter X2 of the upper portion of the lower electrode 7 positioned higher than the second stopper interlayer film 5B. Further, one portion of the bottom face of the lower electrode 7 contacts the upper face of the first conductor 4a, and the rest is positioned at a depth Z1 lower than the upper face of the first conductor 4a. In other words, the lower electrode 7 is connected to the upper face of the first conductor 4a and one portion of the side face. Further, an outer diameter X3 of the lower electrode 7 on the film of the second interlayer insulating film 22 is larger than the outer diameter X2. In FIG. 1C, the outer diameter X3 is not only larger than the outer diameter X2, but also the outer diameter X1. However, as long as the outer diameter X3 is larger than the outer diameter X2, it may be smaller than the outer diameter X1.

Figure 1D:
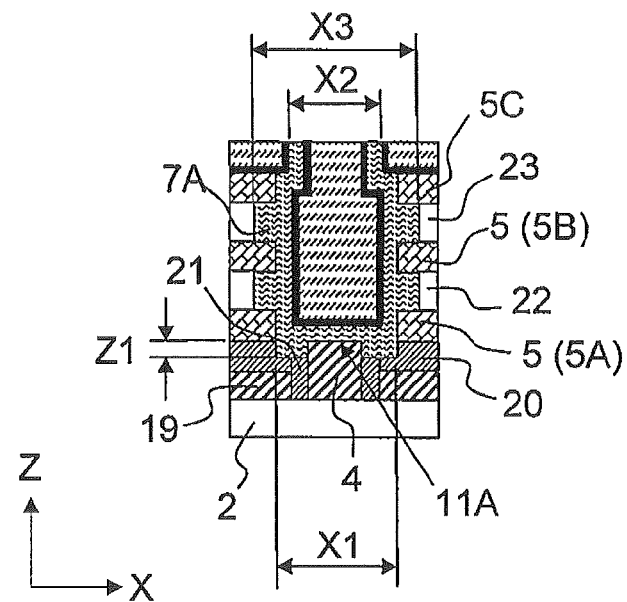
FIG. 1D is a diagram for describing a modified example of the semiconductor device according to the first embodiment of the present invention.

FIG. 1D is a diagram illustrating a modified example of the semiconductor device 100, and illustrates a portion corresponding to FIG. 1C.

With the example illustrated in FIG. 1D, after layering the first stopper interlayer film 5A, the second interlayer insulating film 22, and the second stopper interlayer film 5B, a fourth interlayer insulating film 23 and a third stopper interlayer film 5C are also layered. Then, a hole 11A is formed that penetrates these films, and a crown-shaped lower electrode 7A is formed extending upward from the inside of the hole 11A.

The outer diameter of the lower electrode 7A on the film of the fourth interlayer insulating film 23 is equal to the outer diameter X3 of the lower electrode 7A on the film of the second interlayer insulating film 22. Further, the outer diameter of the lower electrode 7A on the film of the third stopper interlayer film 5C is equal to the outer diameter X1 of the lower electrode 7A on the film of the first stopper interlayer film 5A. Furthermore, the relative relationship of the outer diameters X1, X2, and X3 may be the same as that illustrated in FIG. 1C.

Referring again to FIG. 1B, the support film 18 is connected to one portion of the upper outer peripheral face of the lower electrode 7. The support film 18 mutually supports the adjacent lower electrodes 7, and has the role of keeping these lower electrodes 7 from contacting each other.

The inner and outer peripheral side faces, and the inner peripheral side bottom face and upper face of the lower electrodes 7 are covered by the capacitor insulating film 8 and the upper electrodes 9. As described above, the lower electrode 7, the capacitor insulating film 8, and the upper electrodes 9 configure the cell capacitor 10. Note that the inner peripheral side of the lower electrode 7 is embedded in the upper electrode 9 via the capacitor insulating film 8, but the surface of the capacitor insulating film 8 is covered by a thin upper electrode film, and a plate electrode may be formed on the upper portion after embedding the remaining space with a filling membrane.

An interlayer insulating film 12 is provided covering the upper electrode 9 of the memory cell region 200 to embed the peripheral circuit region 300. With the memory cell region 200, a contact plug 13 that penetrates the interlayer insulating film 12 is connected to the upper electrode 9. Further, with the peripheral circuit region 300, a contact plug 15 that penetrates the interlayer insulating film 12, the second stopper interlayer film 5B, the second interlayer insulating film 22, and the first stopper interlayer film 5A is connected to a first conductor 4b.

A wiring 16 that is connected to each of the contact plugs 13 and 15 is provided on the interlayer insulating film 12. Further, an interlayer insulating film 17 is provided on the interlayer insulating film 12 to cover the wiring 16.

With the semiconductor device 100 described above, the outer diameter X1 of the bottom portion of the lower electrode 7 is larger than the outer diameter X2 of the upper portion. Also, the outer diameter X1 is larger than the outer diameter of the first conductor 4. The bottom face of the lower electrode 7 that has this large outer diameter X1 connects to the first conductor 4. With this configuration, deterioration of the contact area is prevented or suppressed when position shift of the lower electrode 7 occurs during production and an increase of contact resistance can be prevented or suppressed.

In addition, because a roughness is formed on the outer peripheral face of the lower electrode 7 by the differences in the outer diameters, the adhesion between the lower electrode 7, the interlayer insulating film, and the stopper interlayer film is improved, and deformation in the Z-direction of the lower electrode 7 can be prevented.

Next, a method for producing the semiconductor device 100 will be described with reference to FIGS. 2 to 7. The semiconductor device 100 is particularly characterized by the shape of the lower electrode 7, and hereafter, a process for forming the memory cell region 200 including the lower electrode 7 will be mainly described.

FIGS. 2 to 7 are enlarged views of the portion corresponding to the dashed-line frame E in FIG. 1B.

Figure 2:
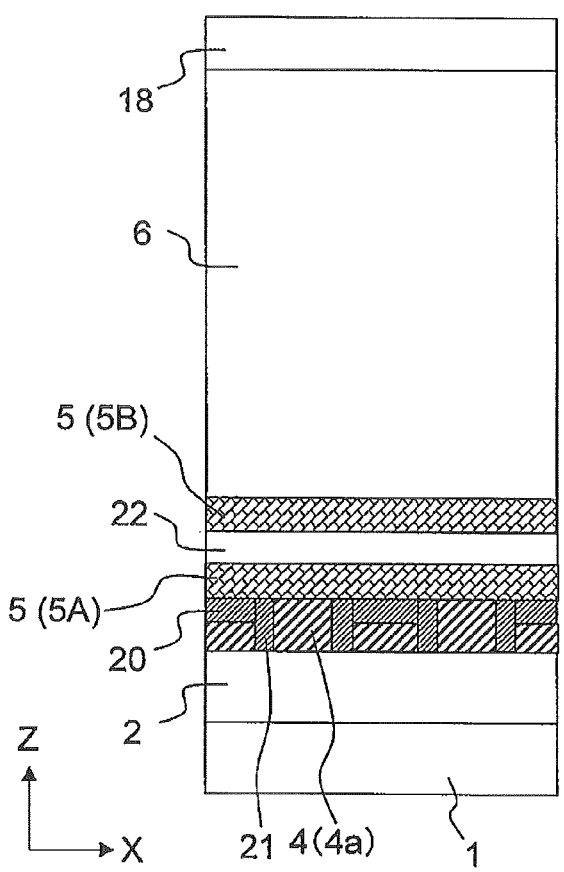
FIG. 2 is a cross-sectional view for describing a method for producing the semiconductor device according to the first embodiment of the present invention.

First, refer to FIG. 2. The semiconductor substrate 1, for example a silicon substrate, is prepared, and a plurality of cell transistors not illustrated are arrayed and formed on one side. The gate insulating film, the gate electrode, and an impurity diffusion layer that will be a source drain is formed using a well-known method.

Next, the interlayer insulating film 2 is formed on the semiconductor substrate 1 to cover the plurality of formed cell transistors. Then, a plurality of first contact plugs not illustrated are formed that penetrate the interlayer insulating film 2 and each connect to the impurity diffusion layer.

Next, the plurality of bit-lines 19 made up of, for example, tungsten (W), are provided on the interlayer insulating film 2. Each bit-line 19 is connected to one of the paired impurity diffusion layers, and is formed to connect the plurality of first contact plugs arranged in the Y-direction. Further, the mask film 20 made up of, for example, a silicon nitride film (SiN), is formed covering the upper face of the bit-lines 19. Next, a side wall insulating film 21 made up of, for example, a silicon nitride film is formed covering a side portion in the X-direction of the bit-lines 19 and the mask film 20.

Next, the area surrounding the bit-lines 19, the mask film 20, and the side wall insulating film 21 is embedded, and a first interlayer insulating film 3 (refer to FIG. 1B) made up of, for example, a silicon dioxide film is formed uniting the upper face of the mask film 20, and the side wall insulating film 21. Afterwards, the first interlayer insulating film 3 is penetrated, and the plurality of first conductors 4 (4a) made up of, for example, tungsten, each connected to the other paired impurity diffusion layer is formed with the side face in the X-direction contacting the side wall insulating film 21.

The formations from the interlayer insulating film 2 to the first interlayer insulating film 3 can each use a well-known method.

Next, the first stopper interlayer film 5A made up of, for example, a silicon nitride film, is formed covering the upper face of the first conductor 4, the mask film 20, the side wall insulating film 19 and the first interlayer insulating film 3. With the formation of the first stopper interlayer film 5A, an atomic layer deposition (ALD) method can be used and the film width can be 30 nm.

Next, the second interlayer insulating film 22 made up of, for example, a silicon dioxide film is formed covering the upper face of the first stopper interlayer film 5A. The second interlayer insulating film 22 is founded with an etching rate higher than a third interlayer insulating film described below during an etching afterwards. For example, with the formation of the second interlayer insulating film 22, a chemical vapor deposition (CVD) method can be used which uses tetraethoxysilane (tetraethylorthosilicate: TEOS): Si(OC2H5)4) and oxygen (O2). As film forming conditions, the TEOS flow rate is 250 standard cubic centimeters per minute (sccm) and the oxygen (O2) flow rate is 2300 sccm, and the heating temperature can be 360° C., the pressure can be 400 Pa, and the high frequency power can be 650 W. Further, the film thickness of the second interlayer insulating film 22 can be, for example, 100 nm.

Next, the second stopper interlayer film is provided on the second interlayer insulating film. The formation of the second stopper interlayer film 5B can be performed with the same process as the first stopper interlayer film 5A. Furthermore, the film thickness of the second stopper interlayer film 5B is the same as the film thickness of the first stopper interlayer film.

Next, the third interlayer insulating film 6 made up of, for example, a silicon dioxide film is formed covering the upper face of the second stopper interlayer film 5B. The third interlayer insulating film 6 is formed with an etching rate lower than the second interlayer insulating film 22 during an etching afterwards. For example, for the formation of the third interlayer insulating film 6, a CVD method can be used that uses monosilane (SiH4), nitrous oxide (N2O), and helium (He) for the raw material gas. As film forming conditions, the monosilane (SiH4) flow rate is 100 sccm, the nitrous oxide (N2O) flow rate is 10000 sccm, and helium (He) flow rate is 9000 sccm, and the heating temperature can be 400° C., the pressure can be 5.5 Torr, and the high frequency power can be 160 W. Further, the film thickness of the third interlayer insulating film 6 can be, for example, 1 μm.

Next, the support film 18 made up of, for example, a silicon nitride film, is formed covering the upper face of the third interlayer insulating film 6. The support film 18 can be formed using an ALD method, and the film thickness can be 130 nm.

Figure 3:
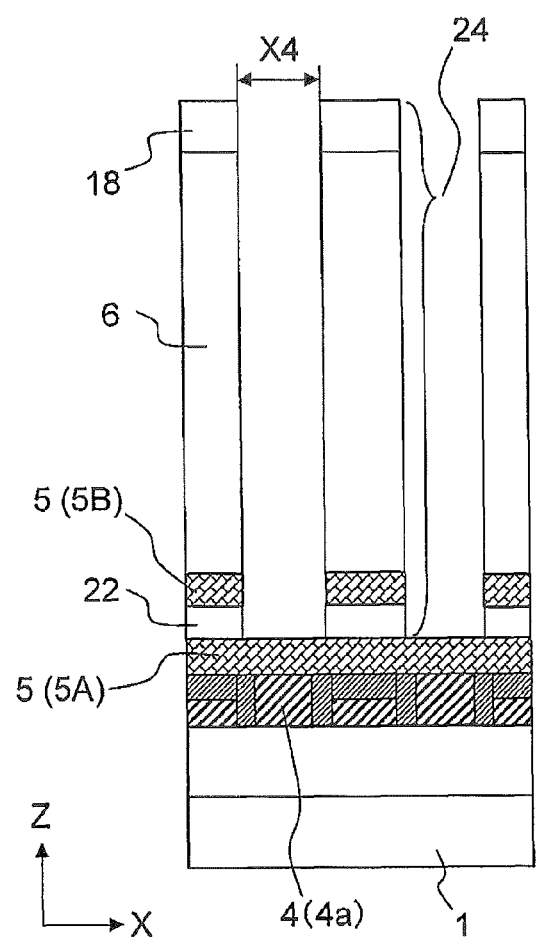
FIG. 3 is a cross-sectional view for describing a process following the process illustrated in FIG. 2.

Next, refer to FIG. 3. A plurality of holes 24 are formed that penetrate the support film 18, the third interlayer insulating film 6, the second stopper interlayer film 5B, and the second interlayer insulating film 22 using a photolithography method and a dry etching method. On the bottom face of each of the holes 24, a portion of the first stopper interlayer film 5A is exposed. The plurality of holes 24 are each formed on a position corresponding to the first conductor 4 (4a). An inner diameter X4 (first inner diameter) of each hole is slightly larger than the outer diameter of the first conductor, for example, 40 nm.

Figure 4:
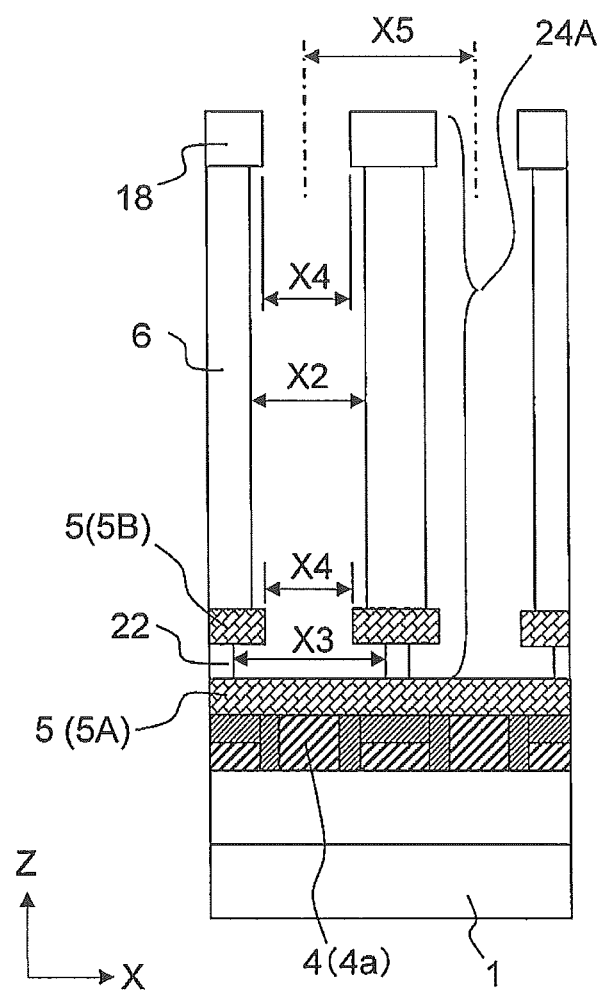
FIG. 4 is a cross-sectional view for describing a process following the process illustrated in FIG. 3.

Next, refer to FIG. 4. A new first contact hole 24A is formed through a wet etching method by removing a portion of the third interlayer insulating film 6 and a portion of the second insulating film 22 which configure the inner walls of the holes 24. As described above, configuring the third interlayer insulating film 6 and the second interlayer insulating film 22 with a silicon dioxide film and configuring the support film 18 and the stopper interlayer film 5 with a silicon nitride film allows selective etching of the third interlayer insulating film 6 and the second interlayer insulating film 22. For this etching, an etchant mixed with a ratio of 1:500 of hydrogen fluoride (HF) and water (H2O) can be used at 23° C.

The inner diameter of the newly formed first contact hole 24A, is different in different portions. More specifically, the support film 18 and the stopper interlayer films 5 (5A and 5B) are not etched because they are configured with a silicon nitride film. Therefore, the inner diameter of the first contact hole 24A on the second stopper interlayer film 5B and the support film 18 is still X4=40 nm.

Meanwhile, the inner diameter of the first contact hole 24A on the third interlayer insulating film 6 and the second interlayer insulating film 22 is expanded to X2 (fourth inner diameter) and X3 (second inner diameter), respectively. With the film forming conditions and the etching conditions described above, the selection ratio of the third interlayer insulating film 6 and the second interlayer insulating film 22 is 1:1.2. This means, for example, that 6 nm is removed from the second interlayer insulating film 22 when 5 nm is removed from the third interlayer insulating film 6. In other words, when 5 nm of the third interlayer insulating film 6 is removed to make the inner diameter X2 of the first contact hole 24A on the third interlayer insulating film 6 50 nm, the inner diameter X3 of the first contact hole 24A on the second interlayer insulating film 22 is 52 nm.

The difference between the inner diameter X2 and X3 comes from the difference in the film formation method of the third interlayer insulating film 6 and the second interlayer insulating film 22 as described above. Specifically, the film formation temperature has a large effect, and film density lowers and the wet etching rate becomes faster when the film formation temperature is lower.

Here, the adjacent first contact holes 24A contact each other when the inner diameter X3 is too large. To prevent this, it is necessary to limit a maximum film thickness dMAX [nm] of the removable second interlayer insulating film 22. For example, defining the pitch (disposal interval) of the first contact hole 24 as X5, the maximum film thickness dMAX [nm] of the removable second interlayer insulating film 22 can be (X5−X4−5)/2.

Note that an HF-based etchant was used in the above example, but an ammonia (NH3)-based etchant can also be used. For example, an etchant mixed with a ratio of 1:200 of ammonia (NH3) and water (H2O) can be used at 75° C. Even when using this type of ammonia-based etchant, the inner diameter X3 can be large as described above.

Figure 5:
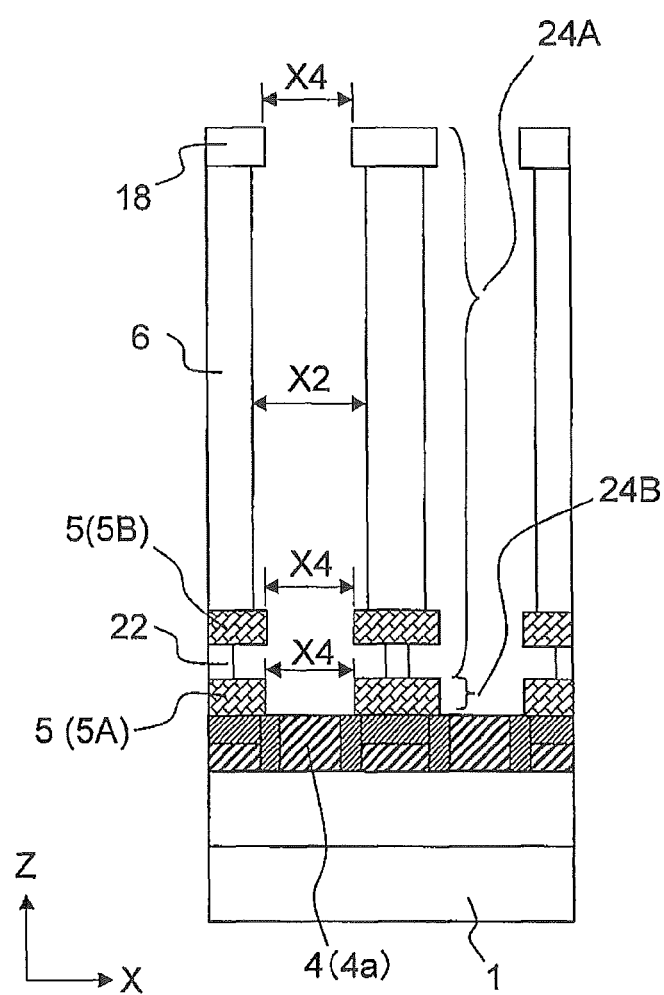
FIG. 5 is a cross-sectional view for describing a process following the process illustrated in FIG. 4.

Next, refer to FIG. 5. A second contact hole (preliminary hole) 24B with the inner diameter X4 successive to the first contact hole 24A is formed on the first stopper film 5A by a dry etching method. At least one portion of the upper face of the first conductor 4 (4A) is exposed on the bottom portion of the second contact hole 24B.

With the dry etching that forms the second contact hole 24B, the support film 18 is used as a mask. Because the support film 18 is configured with a silicon nitride film like the first stopper film, it is etched while the first stopper film 5A is being etched and the film thickness is reduced. In the above example, because the film thickness of the first stopper film 5A is 30 nm and the film thickness of the support film 18 is 130 nm, the film thickness of the support film 18 is reduced from 130 nm to 100 nm while the second contact hole 24B is being formed on the first stopper film 5A.

Figure 6:
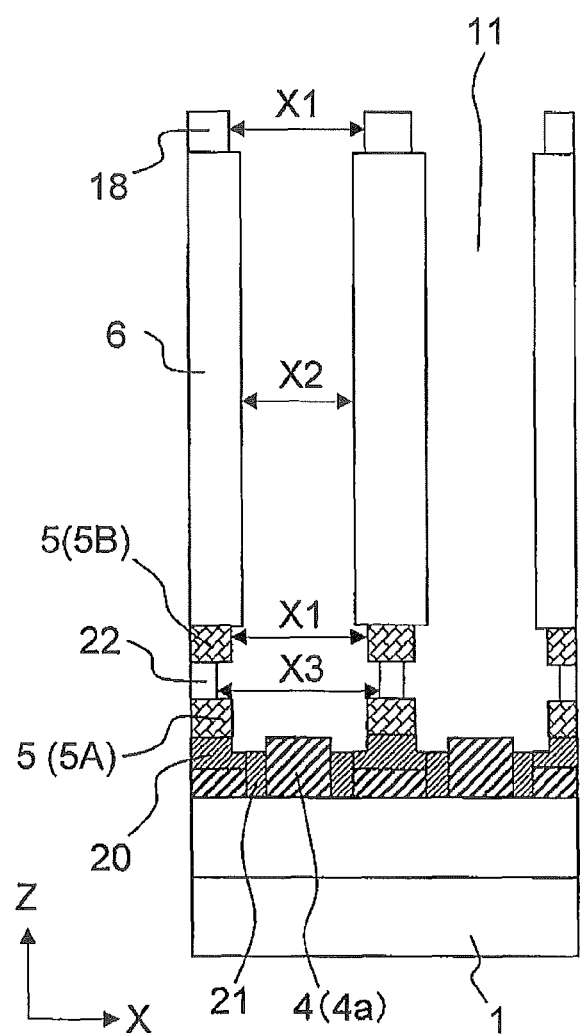
FIG. 6 is a cross-sectional view for describing a process following the process illustrated in FIG. 5.

Next, refer to FIG. 6. Through a wet etching process, one portion of the first stopper interlayer film 5A that configures the inner walls of the second contact hole 24B is removed, and the inner diameter is expanded to X1 (third inner diameter). Phosphoric acid (H3PO4) of 130° to 160° C. can be used for this wet etching process.

When wet etching the first stopper interlayer film 5A, a portion of the second stopper interlayer film 5B and the support film 18 that are silicon nitride films like the first stopper interlayer film 5A are also removed. Further, a portion of the mask film 20 and the side wall insulating film 21 is exposed because a portion of the first stopper interlayer film 5A is removed, and this portion is also removed because the films are configured with a silicon nitride film. A new hole 11 is formed in this manner.

The inner diameter of the hole 11 is different in different portions. The inner diameter of the hole 11 on the second stopper interlayer film 5B is equal to the inner diameter X1 of the hole on the first stopper interlayer film 5A. The inner diameter of the hole 11 on the support film 18 is also equal to the inner diameter X1 of the hole on the first stopper interlayer film 5A. The inner diameter of the holes 11 on the second interlayer insulating film 22 and the third interlayer insulating film 6 that are a silicon dioxide film are each maintained at X3 and X2. For example, when removing the stopper film 5 that is 5.5 nm by wet etching, the inner diameter X1 is 51 nm. In this case, a relationship between X3 (=52 nm)>X1 (=51 nm)> and X2 (=50 nm) is established. However, the relationship between X1>X3> and X2 may be established by increasing the wet etching amount of the stopper film 5.

Further, the first conductor 4 (4a) protrudes on the bottom portion of the hole 11. A portion of the first conductor 4 (4a), the side wail insulating film 21, and the mask film 20 are exposed when the first stopper interlayer film 5A goes through wet etching. The first conductor 4 (4A) that is tungsten is not etched, because the side wall insulating film 21, and the mask film 20 which are made of silicon nitride film have a portion removed. As a result, a portion of the upper face and the side face of the first conductor 4 (4a) is exposed on the bottom portion of the hole 11.

Figure 7:
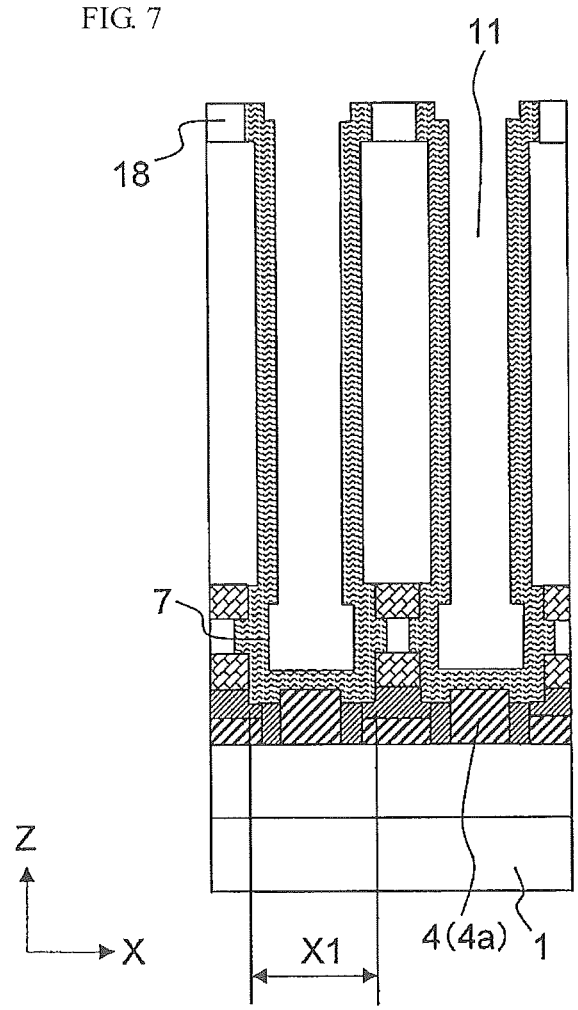
FIG. 7 is a cross-sectional view for describing a process following the process illustrated in FIG. 6.

Next, refer to FIG. 7. A conducting film (second conductor) which becomes the lower electrode 7 is formed covering the inner wall of the hole 11. For example, titanium nitride (TiN) is formed as a conducting film through a sequential flow deposition (SFD) method. At this time, the hole 11 is not completely embedded, and the conducting film is formed with space remaining. Because the first conductor 4 (4a) protrudes from the bottom face of the hole 11, the conducting film contacts not only the upper face of the first conductor 4 (4a) but also the side face. Because of this, the contact area between the first conductor 4 (4a) and the lower electrode 7 is increased compared to when the lower electrode 7 contacts only the upper face of the first conductor 4 (4a), and contact resistance can be reduced. As a result, reduction of contact area and an increase of contact resistance caused by position shift can be prevented or limited.

Next, the conducting film formed on the upper face of the support film 18 is removed and the conducting film is left in the hole 11 by a photolithography method and a dry etching method. The conducting film left on the hole 11 becomes the lower electrode 7. The outer diameter on the bottom portion of the lower electrode 7 formed in this manner is equal to X1.

This is large compared to when simply forming a through-hole and forming the lower electrode on the inner portion (equivalent to the inner diameter X4), and further larger than the outer diameter of the first conductor 4. Furthermore, the interlayer insulating film is not unnecessarily etched like with the related art, and controllability is favorable.

Afterwards, the third interlayer insulating film is completely removed through a well-known method. Then, as illustrated in FIG. 1B, the capacitor insulating film 8 is formed covering the surface (inner peripheral face, outer peripheral face, bottom face, and upper face) of the exposed lower electrode 7, and the upper electrode 9 is additionally formed. In this manner the capacitor 10 is formed. Next, the interlayer insulating film 12 is formed to embed the capacitor 10. Next, the contact plugs 13 and 15 that penetrate the interlayer insulating film 12 are formed, and the wiring 16 that connects to these contact plugs is formed. Additionally, the wiring 16 is covered by the interlayer insulating film 17, and the semiconductor device 100 is completed.

As described above, according to the method for producing the semiconductor device according to the present embodiment, the first stopper film 5A, the second interlayer insulating film 22 with a low film formation temperature, the second stopper film 5B, and the third interlayer insulating film 6 with a high film formation temperature are formed in order on the upside of the first conductor 4. Then, the holes 24, 24A, and 24B that penetrate these films are formed, the inner diameters of the holes 24, 24A and 24B are expanded in portions through a wet etching method, and the hole 11 that becomes the formwork of the lower electrode 7 is formed. Because the inner diameters of the hole 11 on each of the stopper film 5 and the second interlayer insulating film 22 are larger than the inner diameter on the third interlayer insulating film 6, the outer diameter of the bottom face of the lower electrode 7 is larger compared to when simply forming a through-hole and forming the lower electrode inside. Furthermore, the inner diameter of the hole can be more controllably expanded compared to when using a two layered film of the etch stop film and the interlayer insulating film, and the outer diameter of the bottom face of the lower electrode 7 can be larger than the outer diameter of the first conductor 4.

The present invention was described with reference to embodiments, however, the present invention is not limited to the embodiments described above, and various modifications and changes are possible. For example, with the embodiments described above, a first conductor that is a plug is assumed, but the first conductor may be wiring. Further, the film formation method, the etching method, size, and the like described above are examples, and can be arbitrarily selected.

REFERENCE NUMERALS

100 Semiconductor device
200 Memory cell region
300 Peripheral circuit region
1 Semiconductor substrate
2 Interlayer insulating film
3 First interlayer insulating film
4, 4a, 4b First conductor
5A First stopper interlayer film
5B Second stopper interlayer film
5C Third stopper interlayer film
6 Third interlayer insulating film
7, 7A Lower electrode
8 Capacitor insulating film
9 Upper electrode
10 Capacitor
11, 11A Hole
12 Interlayer insulating film
13, 15 Contact plug
16 Wiring
17 Interlayer insulating film
18 Support film
19 Bit-line
20 Mask film
21 Side wall insulating film
22 Second interlayer insulating film
23 Fourth interlayer insulating film
24 Hole
24A First contact hole
24B Second contact hole

What is claimed is:

1. A method for producing a semiconductor device, comprising:
    a process for forming a first conductor on a first interlayer insulating film provided on a semiconductor substrate;
    a process for forming in order a first stopper interlayer film, a second interlayer insulating film, a second stopper interlayer film, and a third interlayer insulating film on the first interlayer insulating film covering the first conductor;
    a process for penetrating the third interlayer insulating film, the second stopper interlayer film, and the second interlayer insulating film, and forming a first contact hole having a first inner diameter on a position corresponding to the first conductor;

a process for expanding the inner diameter of the first contact hole on the second interlayer insulating film to a second inner diameter larger than the first inner diameter; and a process for forming on the first stopper interlayer film a second contact hole successive to the first contact hole, having a third inner diameter larger than the first inner diameter, and exposing the first conductor.

2. The method for producing a semiconductor device according to claim 1, wherein the inner diameter of the first contact hole on the third interlayer insulating film is expanded to a fourth inner diameter larger than the first inner diameter during the process for expanding the inner diameter of the first contact hole on the second interlayer insulating film to the second inner diameter; and the third inner diameter is larger than the fourth diameter.

3. The method for producing a semiconductor device according to claim 1;

wherein the inner diameter of the first contact hole on the second stopper interlayer film is maintained at the first inner diameter during the process for expanding the inner diameter of the first contact hole on the second interlayer insulating film to the second inner diameter.

4. The method for producing a semiconductor device according to claim 1, wherein the process for forming the second contact hole comprises:

a process for forming a preliminary hole on the first stopper interlayer film having the first inner diameter; and a process for enlarging an inner diameter of the preliminary hole to the second inner diameter and making it the second contact hole.

5. The method for producing a semiconductor device according to claim 4, wherein the inner diameter of the first contact hole on the second stopper interlayer film is expanded during the process where the inner diameter of the preliminary hole is expanded to the second inner diameter.

6. The method for producing a semiconductor device according to claim 1, further comprising a process for forming a second conductor covering an inner wall of the first contact hole and the second contact hole and connected to the first conductor after the second contact hole has been formed.

7. A semiconductor device comprising:

a first interlayer insulating film, a first stopper interlayer film a second interlayer insulating film, and a second stopper interlayer film that are layered in order on a semiconductor substrate;

a first conductor formed on the first interlayer insulating film; and a crown-shaped second conductor including a lower portion that penetrates the first stopper interlayer film, the second interlayer insulating film, and the second stopper interlayer film and is connected to the first conductor, and an upper portion that protrudes more towards the upside than the second stopper interlayer film; and an outer diameter of the lower portion being larger than an outer diameter of the upper portion.

8. The semiconductor device according to claim 7, wherein the outer diameter of the portion contacting the second interlayer insulating film of the second conductor is larger than the outer diameter of the portion contacting the first stopper interlayer film.

9. The semiconductor device according to claim 7, wherein the outer diameter of the portion contacting the first stopper interlayer film of the second conductor is larger than the outer diameter of the first conductor.

10. The semiconductor device according to claim 7, wherein the second conductor is one electrode of a capacitor.

11. The semiconductor device according to claim 10, wherein the capacitor is a DRAM cell capacitor.

* * * * *